United States Patent [19]

Feist

[11] 4,216,574

[45] Aug. 12, 1980

[54] CHARGE COUPLED DEVICE

[75] Inventor: Wolfgang M. Feist, Burlington, Mass.

[73] Assignee: Raytheon Company, Lexington, Mass.

[21] Appl. No.: 920,594

[22] Filed: Jun. 29, 1978

[51] Int. Cl.² .................................................. B01J 17/00
[52] U.S. Cl. ................................................. 29/578; 29/571; 29/590; 357/24; 357/91
[58] Field of Search ........................... 29/571, 578, 590; 357/24, 91

[56] References Cited

U.S. PATENT DOCUMENTS

| | | | |
|---|---|---|---|
| 3,950,188 | 4/1976 | Bower | 357/91 |
| 4,062,699 | 12/1977 | Armstrong | 357/91 |

Primary Examiner—W. C. Tupman
Attorney, Agent, or Firm—Richard M. Sharkansky; Joseph D. Pannone

[57] ABSTRACT

A two-phase buried-channel charge coupled device wherein a doped layer of first type conductivity is formed with a predetermined doping concentration under a surface of a semiconductor body of second type conductivity. A first plurality of electrodes is formed in spaced relationship on the surface over the doped layer. Particles generating the first type conductivity are ion implanted into regions of the doped layer between the first plurality of electrodes, increasing the doping concentration of the portion of the doped layer disposed beneath such spaced regions. A second plurality of electrodes is formed over the increased concentration portions of the doped layer. The first plurality of electrodes provides the transfer gates of the device and the second plurality of electrodes provides the storage gates for the device.

5 Claims, 21 Drawing Figures

CHARGE COUPLED DEVICE

BACKGROUND OF THE INVENTION

This invention relates generally to charge coupled devices (CCD's) and more particularly to two-phase buried-channel charge coupled devices.

As is known in the art, charge coupled devices generally include a plurality of gates disposed over the surface of a semiconductor substrate intermediate an input (or source) region and an output (or drain) region formed in the substrate. In response to proper phasing and clocking of the gates electric charge introduced into the source region is shifted, unidirectionally, parallel to the surface of the substrate until the charge is removed at the drain region. The charge is shifted in well defined spatial intervals, called cells, and temporal intervals, called clock periods. Generally charge coupled devices may be characterized by two features, one related to the clocking or phasing (namely two-, three- or four-phase structures) and one relating to the location in the substrate of the charge transport (namely surface channel structure or buried channel structure).

Two-phase charge coupled devices have the minimum circuit complexity. In such devices two sets of interleaved gate electrodes are generally used, one such set of gate electrodes being clocked with signals which are out-of-phase with the signals clocking the other set of gate electrodes. In one two-phase surface-channel device each gate electrode is made up of two sections, a first one of such sections being formed on an oxide layer formed over the substrate which is thicker than the oxide layer over which a second one of such sections is formed. In this way the electrical potential under the second one of such sections will be higher than the electrical potential under the first one of the sections of the gate electrodes. Therefore, while each section of the gate electrode is coupled to the same clocking signal, two different electrical potentials are produced under each one of the sections of such gate electrode. In the process of shifting charge is first introduced into the portion of the substrate disposed beneath the first section of the gate electrode (such section sometimes being referred to as the "transfer well") and such charge is then transferred to the portion of the substrate disposed beneath the second section of the gate electrode (such section sometimes being referred to as the "storage well").

In another type of two-phase surface-channel coupled device each gate electrode is formed in two steps. Here the sections of the gate electrodes disposed over the storage wells are first formed in spaced relationship over an oxide formed over the surface of a p-type silicon substrate. These sections of the gate electrodes are used as an ion implantation mask and boron ions are thereby ion implanted into the portions of the silicon substrate disposed between adjacent ones of the formed sections of gate electrodes thereby providing enhanced p-type doping for the transfer wells, the enhanced additional p-type dopant reducing the electrical potential in the substrate relative to the potential in the storage wells. The second sections of the gate electrodes are then formed over the doped transfer wells.

In order to improve the speed and charge transfer efficiency of the charge coupled device the fringing electric field between gate electrodes of adjacent cells, specifically its component along the surface of the substrate, is utilized to speed up the transport of charge carriers by forming a charge transport channel beneath the surface of the substrate. Beneath the surface the electric field parallel to the substrate surface is stronger than at the surface. The two-phase buried channel charge coupled device therefore combines the advantage of minimum circuit complexity and high speed of operation with minimum charge loss during charge transport between adjacent cells. One common method to produce a two-phase buried-channel device includes forming the gate electrodes in two sections, the sections disposed over the storage wells being formed first over a p-type silicon substrate having an n-type doped buried channel formed therein. The n-type buried channel has a concentration consistent with that desired for the storage wells. These sections of the gate electrodes, which are disposed over the storage wells, are used as an ion implantation mask and a p-type dopant, such as boron, is implanted into the portions of the n-type buried channel which are disposed under the spaces between the sections of the gate electrodes first formed. The p-type dopant is implanted at a concentration to partially compensate the n-type dopant in the buried channel region, thereby forming the transfer wells of the device. The second portions of the gate electrodes are then formed over the transfer wells.

While such method is customarily used to produce two-phase buried channel devices, the difficulty in controlling the partially compensated doping limits reproducibility on a production basis since, for example, a complete annihilation of the n-type channel regions by the p-type dopant will destroy the buried channel. Further, the use of a compensation dopant increases the amount of total n-type and p-type dopant in the transfer wells and hence increases physical damage to the substrate, thereby creating increased numbers of trapping states (or centers) and recombination centers which degrade the charge transfer characteristics and so-called "dark current" of the device with concomitant reduction in operating speed and storage times. Further, when the n-type buried channel is formed using a shallow epitaxial n-type layer (having a thickness in the order of 2000–6000 Å) over the surface of a p-type silicon substrate the crystallographic characteristics of such epitaxial layer are not as perfect as those of the substrate, thereby reducing the speed and increasing the "dark current" of the device. Further, out diffusion of impurities in the substrate into the epitaxial layer may reduce the efficiency of the device. While such buried channel may be formed using an n-type ion implantation prior to the formation of the first sections of the gate electrodes, the control of a p-type implantation to properly partially compensate the n-type dopant in the transfer wells becomes extremely difficult since it is desirable that the p-type dopant have nearly the same distribution profile in depth as the n-type dopant and that the partially compensated doping profile is easily predictable and insensitive to fluctuations in processing conditions. However, since different dopants are used, each with a different implantation level requirement and different implant distributions, and because such different dopants will diffuse differently during subsequent heating cycles, as annealing and oxidation, proper partial compensation over the entire depth of the buried channel does not occur. Still further, complications arise because the n-type dopant and p-type dopant may adversely influence each other during the diffusion and, in addition, may exhibit different degrees of activation after the subsequent heating cycles.

SUMMARY OF THE INVENTION

In accordance with the present invention a doped layer is formed with a predetermined doping concentration under a surface of a semiconductor body; a first plurality of electrodes is formed in spaced relationship over the doped layer; particles are ion implanted into regions of the doped layer between the first plurality of electrodes, increasing the doping concentration of portions of the doped layer disposed beneath such spaced regions; and a second plurality of electrodes is formed over the ion implanted portions of the doped layer.

In a preferred embodiment of the invention the doped layer is formed by ion implanting an n-type dopant into a silicon body. Such n-type dopant is implanted having a peak doping concentration at a predetermined depth from the surface of a p-type silicon body. The doping concentration is selected in accordance with the doping required for the transfer wells of the buried channel charge coupled device being formed. After formation of the first plurality of gates using chemical vapor deposition and doping at relatively low temperatures and short temperature cycles, photolithographic and chemical etching processing, the same n-type dopant is implanted between the spaced regions of the first plurality of electrodes using substantially the same doping concentration level and same implantation energy level. Because the depth of the n-type dopant formed during the first ion implantation has not changed substantially because only relatively low temperature processing for short periods of time has been used between the first and second implantation, the n-type dopant formed during the second implantation will have a peak doping concentration equal to that of the first implanted n-type dopant and the peak concentration of such second n-type dopant implantation will occur very nearly at the depth of the peak dopant concentration of the first implantation. The portions of the n-type layer have the additional doping concentration required to form the storage wells of the device.

With such process only one doping species is used in the formation of the storage wells and transfer wells of the buried channel, thereby facilitating in the control required to form such buried layer structure. Further, less dopant is required in the buried layer compared to a technique which uses a p-type dopant to partially compensate for a previously formed n-type layer because with this process a relatively low doping concentration layer for the transfer wells is increased in those regions of such layer for the storage wells, whereas in the compensation scheme a relatively high doped layer for the storage wells is additionally doped with p-type dopant in those regions for the transfer wells. The reduction in dopant implantation reduces physical damage to the surface region of the substrate, thereby reducing the trapping states or centers and increasing the speed of the device and lowering the "dark current".

It is also noted that by changing the magnitude and ratio of the implant doses the depth of the storage and transfer wells for a given gate voltage can be easily adjusted to meet specific operating characteristics since the relative implant distribution and diffusion profile remain essentially the same.

BRIEF DESCRIPTION OF THE DRAWINGS

The foregoing features of this invention, as well as the invention itself, may be more fully understood from the following detailed description read together with the accompanying drawings, in which:

FIGS. 1 through 13 are views, greatly distorted and somewhat simplified, of a portion of a charge coupled device according to the invention at various steps of the manufacture thereof, FIGS. 1 through 7 being cross-sectional elevation views, FIG. 8 being a plan view (FIG. 7 being a cross-sectional elevation view taken along line 7—7 of FIG. 8), FIGS. 9A, 9B being cross-sectional elevation views taken along lines 9A—9A and 9B—9B of FIG. 8; FIG. 13 being a plan view.

DESCRIPTION OF THE PREFERRED EMBODIMENT

Two-Phase Buried-Channel Charge Coupled Device

Figure 1:
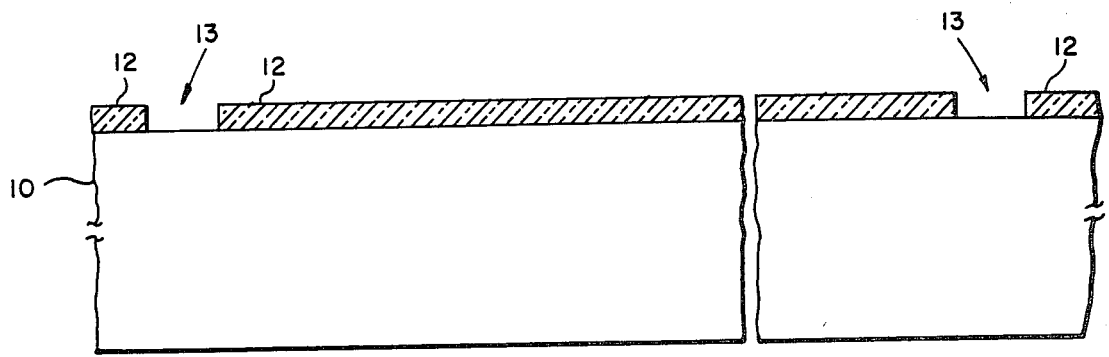
Figure 2:
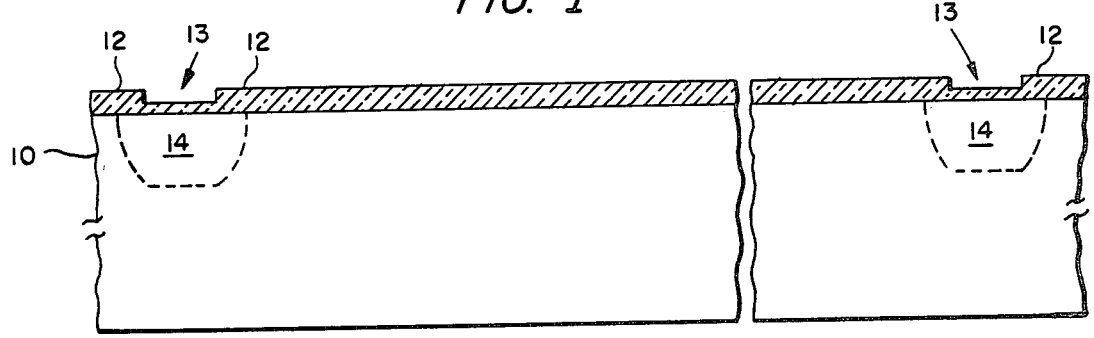

Referring now to FIGS. 1 through 13, the fabrication of a two-phase buried channel charge coupled device in accordance with this invention will be described. A semiconductor body 10, here silicon having p-type conductivity with a resistivity here in the order of 10 to 40 ohms-cm, has a layer 12 of silicon dioxide formed on an upper surface thereof, as shown in FIG. 1. Here such layer 12 is formed by conventional thermal oxidation, the thickness of such layer 12 here being in the order of 7500 Å. Windows 13 are formed in selected regions of the silicon dioxide layer 12, as shown, to enable the formation of a guard band region around the periphery of the charge coupled device. Such windows 13 are here formed using conventional photolithographic-chemical etching processing. A p-type dopant, here boron, is then implanted, annealed and then diffused into the portions of the semiconductor body 10 exposed by the etched windows 13 in a conventional manner to form the guard band regions 14, as shown in FIG. 2. It is noted that during the diffusion process silicon dioxide is formed in the previously etched windows 13, as shown. Here the thickness of the silicon dioxide formed in the windows 13 during the diffusion process is in the order of 5000 Å. Further, here the depth of the diffused isolation regions 14 from the surface of the semiconductor body 10 is in the order of 2 to 3 $\mu$m.

Figure 3:
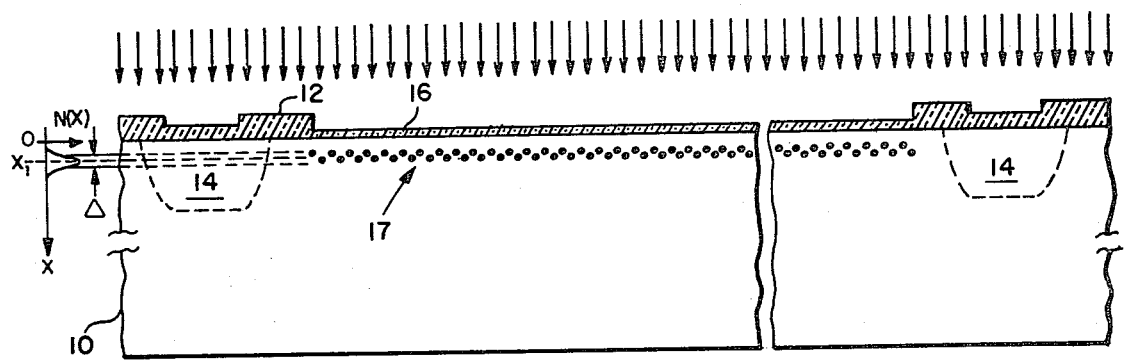

The major portion of the silicon dioxide layer 12 disposed within the guard-band regions 14 is removed using conventional photolithographic-chemical etching techniques, thereby exposing a corresponding major portion of the surface of the semiconductor body 10. A gate oxide layer 16, here a layer of silicon dioxide, is thermally grown over the exposed portion of the semiconductor body 10 in a conventional manner as shown in FIG. 3. Here the gate oxide layer 16 of silicon dioxide is formed with a thickness in the order of 1200 to 1500 Å.

The upper surface of the structure is then exposed to a suitable n-type dopant, here phosphorus, using conventional ion implantation apparatus, to form a uniform buried layer 17 for the charge coupled device, as shown in FIG. 3. Here the phosphorous is implanted with a peak concentration $N(X)_1$ at a depth $X_1$, here 0.2 to 0.25

μm from the upper surface. The implantation dosage is here $5 \times 10^{11}$ atoms/cm$^2$. Such implantation is here obtained using an implantation energy level in the order of 300 Kev. Here the peak concentration $N(X_1)$ is in the order of $4 \times 10^{16}$ atoms/cm$^3$. It is noted that the doping concentration $N(X)$ falls off symmetrically about the depth $X_1$ and reaches a level of 0.6 times the peak concentration, $N(X_1)$, here in the order of 750 Å on either side of the depth $X_1$, thereby forming an n-type layer which may be considered as having a width $\Delta$, here in the order of 0.15 μm. It is noted that the thicker oxide layer 12 formed over the guard band regions 14 shields the underlying portions of the semiconductor body 10 from the phosphorus implant.

Figure 4:
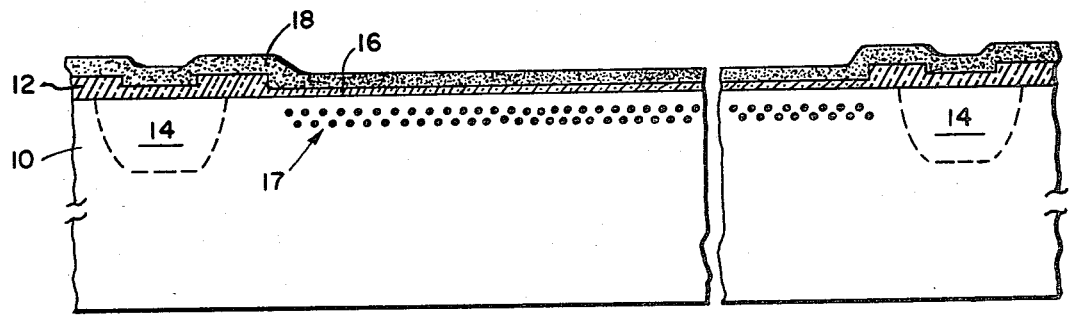

Referring now to FIG. 4, a polycrystalline silicon layer 18 is deposited over the silicon dioxide layers 12, 16, as shown, using conventional techniques, here by chemical vapor deposition. Here the thickness of the polycrystalline silicon layer 18 is in the order of 5000 Å. The polycrystalline silicon layer 18 is then doped with a suitable dopant to increase its electrical conductivity. Here phosphorus is diffused into the polycrystalline silicon layer 18 using conventional techniques to provide a relatively high doping concentration, here in the order of $10^{19}$ to $10^{20}$ atoms/cm$^3$. It is noted that the diffusion is performed at relatively low temperature levels, here in the order of 900° C. for a relatively short time, here in the order of 5 to 15 minutes, so that the profile of the prior buried layer 17 of phosphorous does not substantially change in depth.

Figure 5:
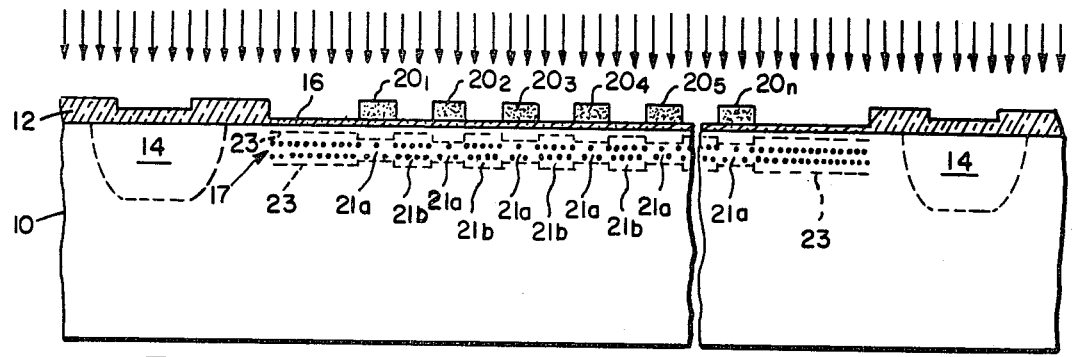
Figure 14:
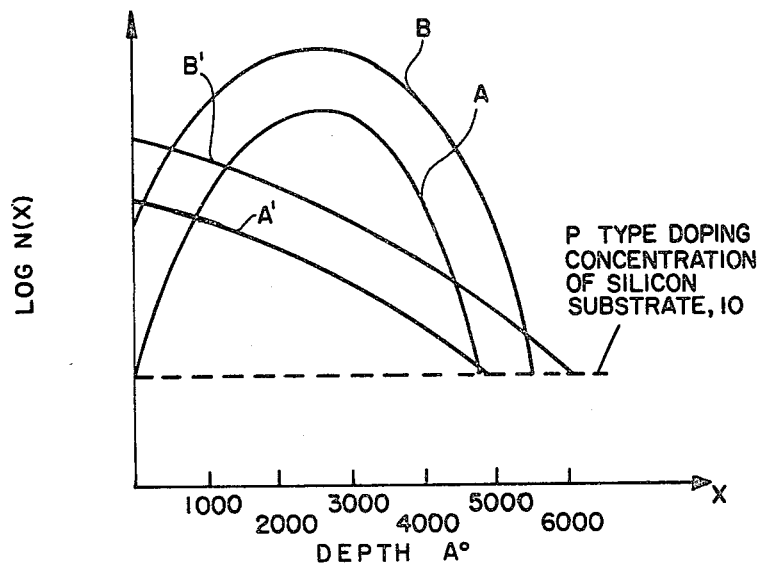
FIG. 14 shows schematic curves showing the doping concentration profile of the buried layer on a logarithmic scale as a function of depth from the surface of the silicon substrate of the device.

Referring now to FIG. 5, the doped polycrystalline silicon layer 18 is patterned into regularly spaced electrodes $20_1$-$20_n$ as shown, using conventional photolithographic-plasma etching techniques. Again it is noted that the photolithographic-plasma etching process is a low temperature process and hence during such process the depth and doping distribution of the implanted phosphorus in the buried layer 17 does not change. As will become apparent hereinafter, each one of such electrodes $20_1$-$20_n$ is deposited over a transfer well of the charge coupled device and hence such electrodes $20_1$-$20_n$ may be considered as transfer gates or transfer gate electrodes. The surface of the structure is then exposed to the same dopant, i.e. phosphorus, using the same implantation conditions as used in forming the buried layer 17. Also, the same dosage, here $5 \times 10^{11}$ atoms/cm$^2$, is implanted at the same depth $X_1$ (here 0.2 to 0.25 μm) from the upper surface of the structure using the same implantation energy level, here 300 Kev, as described in connection with FIG. 3. As noted, there has been no substantial diffusion of the phosphorus in layer 17 as the chemical vapor deposition process used to form the polycrystalline silicon layer 18 (FIG. 4), the diffusing process to increase the electrical conductivity of layer 18 and the photolithographic-plasma etching process used to form electrodes $20_1$-$20_n$ from layer 18 have each been relatively low temperature and short heat cycle processes as described above. It is noted that here the silicon dioxide layer 12 and the doped polycrystalline silicon electrodes $20_1$-$20_n$ provide an ion implantation mask during the phosphorus implant to inhibit such phosphorus dopant from portions of the buried layer 17 disposed under the layer 12 and the electrodes $20_1$-$20_n$ while enabling the phosphorus dopant to increase the doping concentration level of the phosphorus in the portions of buried layer 17 which are disposed beneath the spaces between the electrodes $20_1$-$20_n$ as shown in FIG. 5. That is, the present implantation increases the n-type phosphorus dopant dosage of the unmasked portions of the buried layer 17 to the order of $10^{12}$ atoms/cm$^2$ at the depth $X_1$, here 0.2 to 0.25 μm, while an n-type phosphorus dosage of $5 \times 10^{11}$ atoms/cm$^2$ remains in the masked portions of such buried layer 17. It is noted then that an n-p junction is formed, after conventional annealing, between the boundary of the implanted buried layer 17 and the silicon substrate 10, such junction being shown by the dotted line 23 in FIG. 5. Because there is greater doping concentration under the regions 21b (between the electrodes $20_1$-$20_n$) the depth of this portion of the junction is less than the depth of the portion of the junction which is in the regions 21a (beneath the electrodes $20_1$-$20_n$). As will be described hereinafter, the more highly doped regions 21b of the buried layer 17 form the storage wells of the charge coupled device and the more lightly doped regions 21a of such layer 17 form the transfer wells of such device. The doping profiles for the regions 21a, 21b are shown in FIG. 14 and are labeled as curves A and B, respectively.

Figure 6:
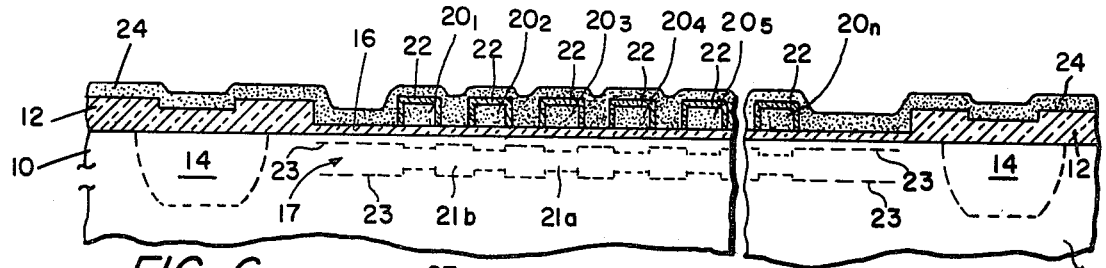

Referring now to FIG. 6, a silicon dioxide layer 22 is formed over the electrodes $20_1$-$20_n$, here using conventional thermal oxidation, as shown. It is noted that the implanted phosphorus in the buried layer 17 diffuses during this oxidation process, the initially implanted phosphorus and the later implanted phosphorus diffusing together in like manner to increase the width, $\Delta$, of the buried layer 17.

A polycrystalline silicon layer 24 is then formed over the upper surface of the structure, as shown, here using conventional chemical vapor deposition. Here the thickness of the polycrystalline layer 24 is in the order of 5000 Å and is then doped with a suitable dopant, here phosphorus, using conventional diffusion to a concentration of $10^{19}$ to $10^{20}$ atoms/cm$^3$ to increase the electrical conductivity of such polycrystalline silicon layer 24 for reasons to become apparent hereinafter. It is first noted that the silicon dioxide layer 22 electrically insulates the electrodes $20_1$-$20_n$ from the doped polycrystalline silicon layer 24. It is next noted in FIG. 6 that portions of the doped polycrystalline silicon layer 24 extend down onto the portions of the silicon dioxide layer 16 on the upper surface of the semiconductor body 10 disposed between adjacent ones of the electrodes $20_1$-$20_n$, as shown, that is, onto those portions of the silicon dioxide layer 16 on the upper surface of the semiconductor body 10 which are above the more heavily phosphorus doped portions of the buried layer 17, i.e. the storage wells of the charge coupled device.

Figure 7:
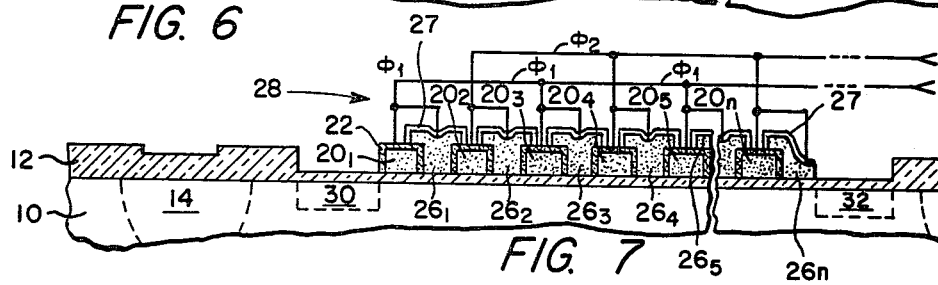

Referring now to FIG. 7, the polycrystalline silicon layer 24 (FIG. 6) is patterned into regularly spaced electrodes $26_1$-$26_n$, as shown, using conventional photolithographic-plasma etching processing. As noted, electrodes $20_1$-$20_n$, $26_1$-$26_n$ are disposed over the more highly n-doped portions of the buried layer, i.e. the storage wells, and hence such electrodes may be considered as providing the overall gate region 28 of the charge coupled device. The source (input region) 30 and the drain (output) region 32 are formed, as shown in FIG. 7, by ion implanting additional phosphorus into such regions 30, 32, using the silicon dioxide layer 12 and the electrodes $20_1$-$20_n$, $26_1$-$26_n$ of the overall gate region 28 as ion implantation masks. The dosage of Phosphorus in the source and drain regions 30, 32 is here in the order of $5 \times 10^{14}$ atoms/cm$^2$, and the implantation energy level is in the order of 200 Kev. After conventional annealing a silicon dioxide layer 27 is then grown, here by thermal oxidation, over the electrodes $26_1-26_n$. It is noted that during this oxidation process the temperatures used are in the range of 1000° C. for about two hours. The width of the buried layer 17 again spreads because of this high temperature, long period heating cycle and the width of the layer 17 (FIG. 6) increases to the order of 0.6 μm under the storage gates (i.e. regions 21b (FIG. 6)) and to 0.3 μm under the storage gates (i.e. under regions 21a (FIG. 5)) as shown in FIG. 14 by curves labeled B' and A', respectively. (As will be described, each transfer gate electrode $20_1-20_n$ is electrically coupled to the one of the storage gate electrodes $26_1-26_n$ to its right as shown schematically in FIG. 7. That is, transfer gate electrode $20_1$ is electrically connected to storage gate electrode $26_1$ and transfer gate electrode $20_2$ is electrically connected to storage gate electrode $26_2$, etc.. Further, transfer gate electrodes $20_1$, $20_3$, $20_5$, etc. (and hence storage gate electrodes $26_1$, $26_3$, $26_5$, etc.) are electrically connected to a clocking signal bus $\phi_1$, whereas transfer gate electrodes $20_2$, $20_4$ . . . $20_n$ (and here storage gate electrodes $20_2$, $20_4$ . . . $20_n$) are electrically connected to a clocking bus $\phi_2$. The clocking signal buses $\phi_1$, $\phi_2$ are coupled to out-of-phase signals during operation of the charge coupled device.)

Figure 8:
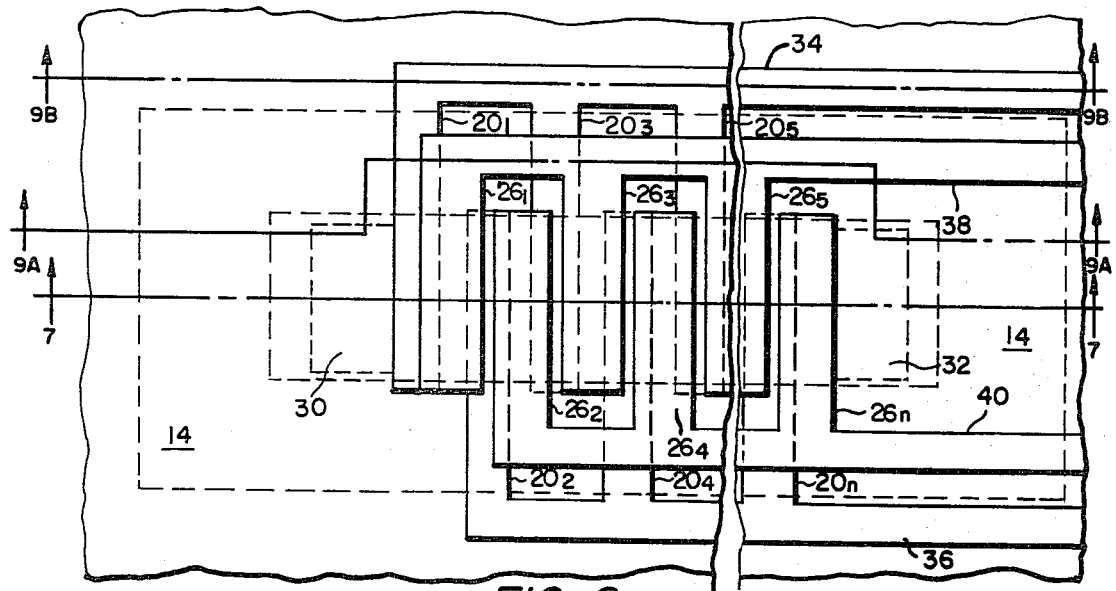

Referring now to FIG. 8 a plan view of the upper surface of the structure in FIG. 7 is shown. As noted, the patterns of both the transfer gate electrodes $20_1-20_n$ and the storage gate electrodes $26_1-26_n$ are each formed as two electrically interconnected electrodes. In particular, transfer gate electrodes $20_1$, $20_3$, $20_5$, etc. are electrically interconnected by a portion of the doped polycrystalline silicon layer 18 (FIG. 4) (now coated with silicon dioxide layer 22 (FIG. 7) being formed as a bus 34 (such bus 34 not being shown in FIG. 5 for simplicity in explanation). Likewise, transfer gate electrodes $20_2$, $20_4$ . . . $20_n$ are electrically interconnected by a portion of the doped polycrystalline silicon layer 18 (FIG. 5) (now coated with silicon dioxide layer 22 (FIG. 7) being formed as a bus 36. Similarly, storage gate electrodes $26_1$, $26_3$, $26_5$, etc. are electrically interconnected by a portion of the doped polycrystalline silicon layer 24 (FIG. 6) (now coated with silicon dioxide layers 27 (FIG. 7)) being formed as a bus 38 and storage gate electrodes $26_2$, $26_4$ . . . $26_n$ are electrically interconnected by a portion of the doped polycrystalline silicon layer 16 (FIG. 6) (now coated with silicon dioxide layer 27 (FIG. 7)) being formed as a bus 40. The polycrystalline silicon forming buses 34, 36 are formed using conventional photolithographic-chemical etching processes during the formation of electrodes $20_1-20_n$ and the buses 38, 40 are formed using conventional photolithographic chemical etching processing during the formation of storage gate electrodes $26_1-26_n$. Buses 34, 38 are electrically connected to a source of clocking signals $\phi_1$ by any conventional means (not shown) and buses 36, 40 are electrically connected to a source of out-of-phase clocking signals $\phi_2$ (not shown) by any conventional means during operation of the two-phase buried channel charge coupled device. Such connections may be made either on the wafer or external to the wafer.

Metalization System

Referring now to FIGS. 9A, 9B, 10A, 11A, 11B, 12A, 12B and 13, the formation of the metalization system for the charge coupled device will now be described. First, referring to FIGS. 9A and 9B, contact windows or vias 42, 44 for the source and drain regions 30, 32, respectively, as shown, and for the buses 34, 38, are formed in selected portions of silicon dioxide layers 16, 22, 27, respectively, as shown, using conventional photolithographic-chemical etching processing. (It should be noted that a contact via is formed through the silicon dioxide layer 22 formed over bus 36 (FIG. 8) and through the silicon dioxide layer 27 formed over bus 40 (FIG. 8).)

Figure 9A:
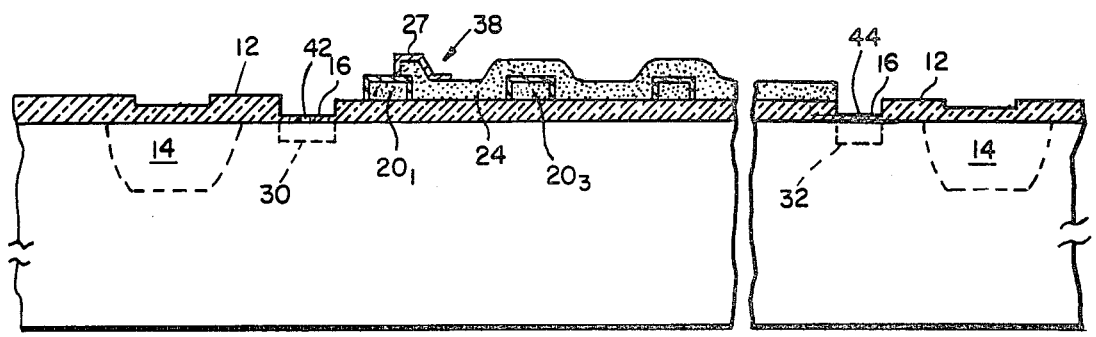
Figure 9B:
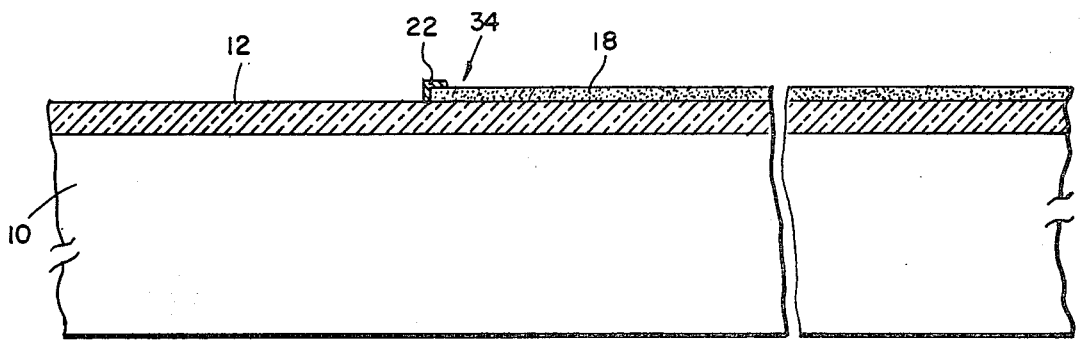
Figure 10A:
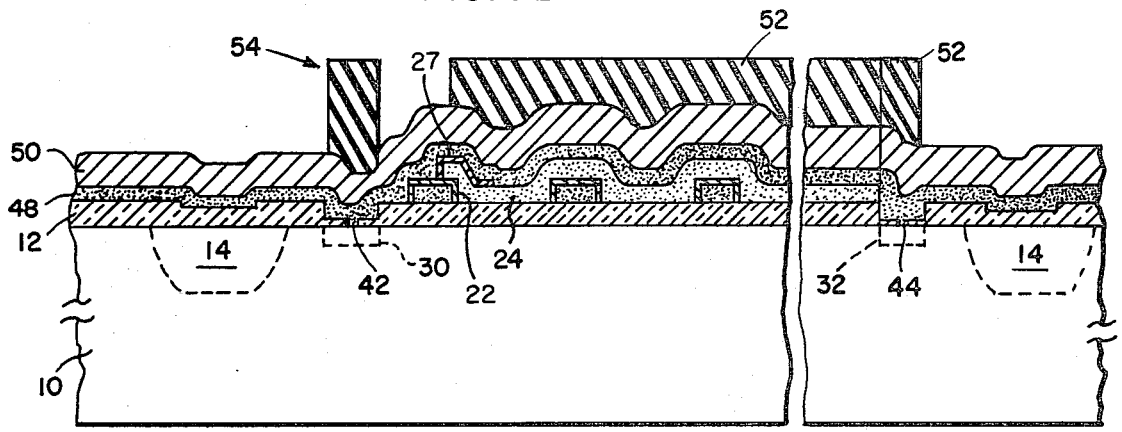
FIGS. 10A, 10B, 11A, 11B, 12A, 12B being cross-sectional elevation views.
Figure 10B:
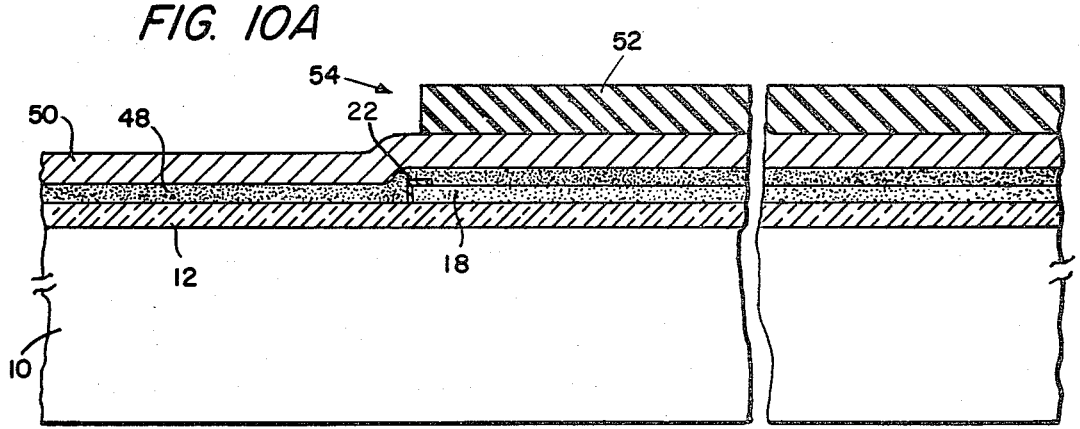

Referring now to FIGS. 10A and 10B, a polycrystalline silicon layer 48 is formed over the upper surface of the structure and through the contact vias 42, 44 onto the exposed portions of the surfaces of the source and drain regions 30, 32 and onto the exposed portions of the polycrystalline silicon layers 18, 24 forming the buses 36, 38 (FIGS. 9A, 9B and 34, 40 (FIG. 8)), as shown. Such polycrystalline silicon layer 48 is formed by conventional chemical vapor deposition having a thickness here of 1500 to 2000 Å. The deposition is carried out in a suitable furnace heated to about 700° C. in the deposition zone by flowing a gas mixture of one percent $SiH_4$ and ninety-nine percent $N_2$ over the upper surface of the structure. Under the influence of this high temperature the silane decomposes and silicon precipitates onto the upper surface of the structure. The polycrystalline silicon layer 48 is then highly doped with phosphorus using conventional diffusion processing, here using a temperature of 920° C. to 950° C. to increase the electrical conductivity of such polycrystalline silicon layer 48 (i.e. a resistivity in the order of 20 to 50 ohms/$cm^2$). The highly doped polycrystalline silicon layer 48 is thus in ohmic contact with source and drain regions 30, 32 and is electrically connected to the doped polycrystalline silicon layers 18, 24 of buses 34, 38 (FIGS. 9A, 9B). The use of the chemical vapor deposition process provides the doped polycrystalline silicon layer 48 with good, continuous, substantially uniform thickness as such layer 48 passes over the irregular, nonplanar, upper surface of the structure.

Figure 11A:
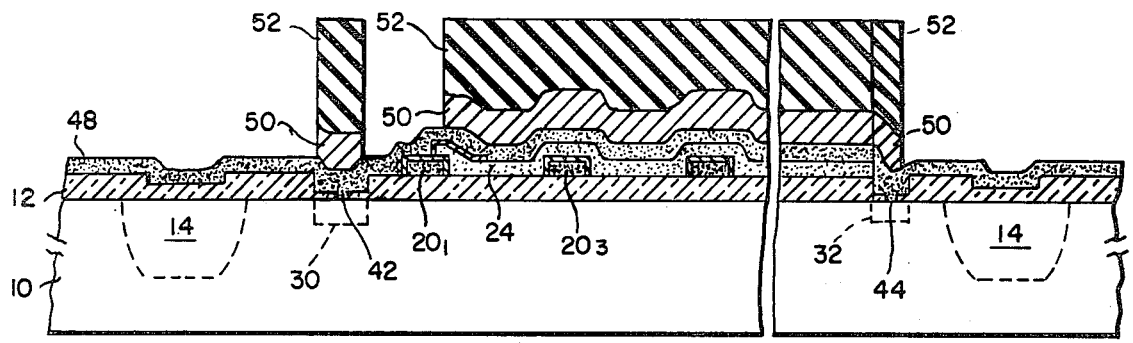
Figure 11B:
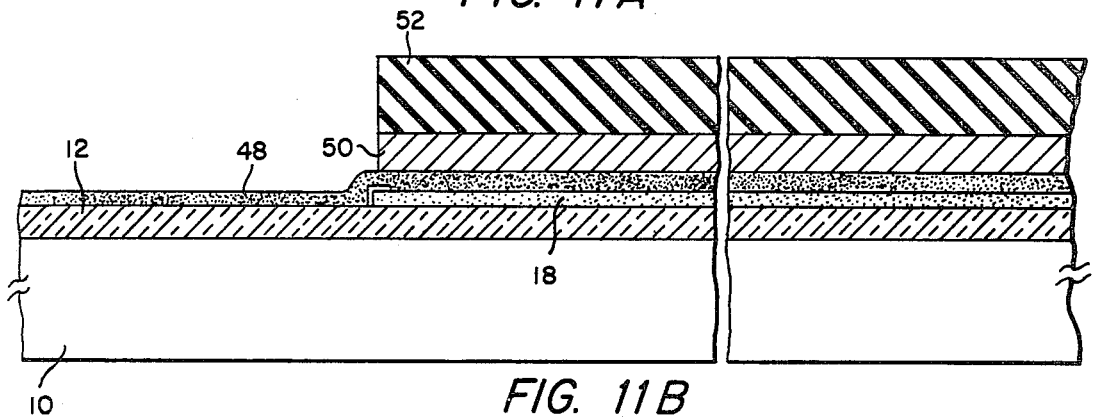

An aluminum layer 50 is evaporated over the doped polycrystalline silicon layer 48 using any conventional process, as shown in FIGS. 10A, 10B. Here such aluminum layer 50 is formed with a thickness of 2000 to 10,000 Å. Next, a suitable photoresist 52 is deposited over the surface of the structure and patterned in a conventional manner to form a mask 54, as shown. The unmasked portions of the aluminum layer 50 are then brought in contact with a suitable chemical etchant, here 80 ml $H_3PO_4$, 10 ml $H_2O$, 5 ml $CH_3COOH$ and 5 ml $HNO_3$ at a temperature of 40° C. to etch away the exposed portions of the aluminum layer 50, as shown, without attaching the underlying doped polycrystalline silicon layer 48, thereby forming a pattern of aluminum conductors as shown in FIGS. 11A and 11B for the source region 30, the drain region 32 and the buses 34, 36, 38, 40 (FIG. 8).

Figure 12A:
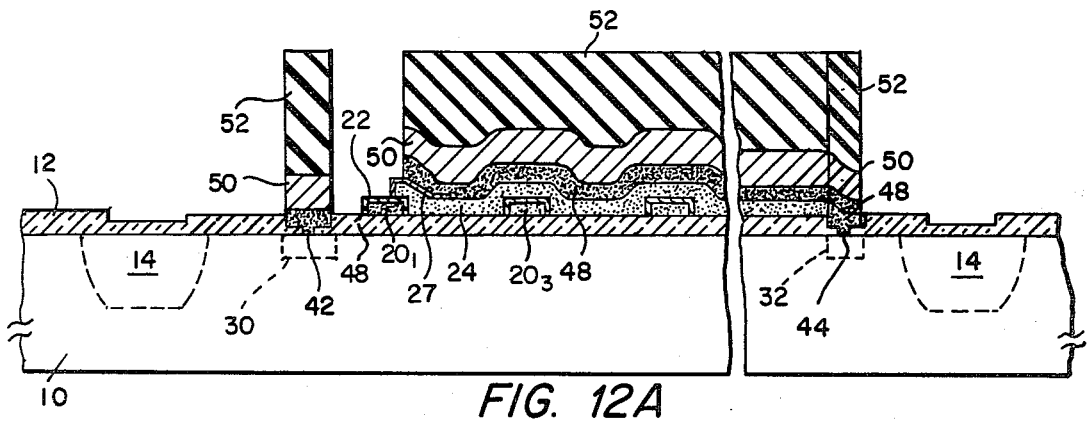
Figure 12B:
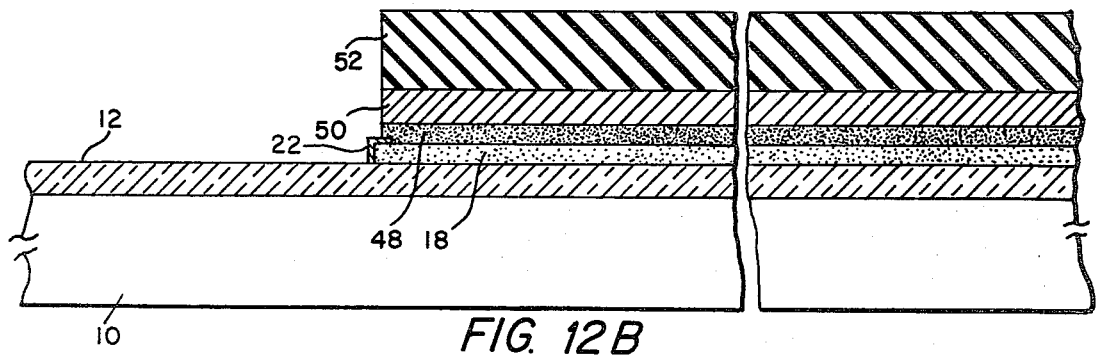
Figure 13:
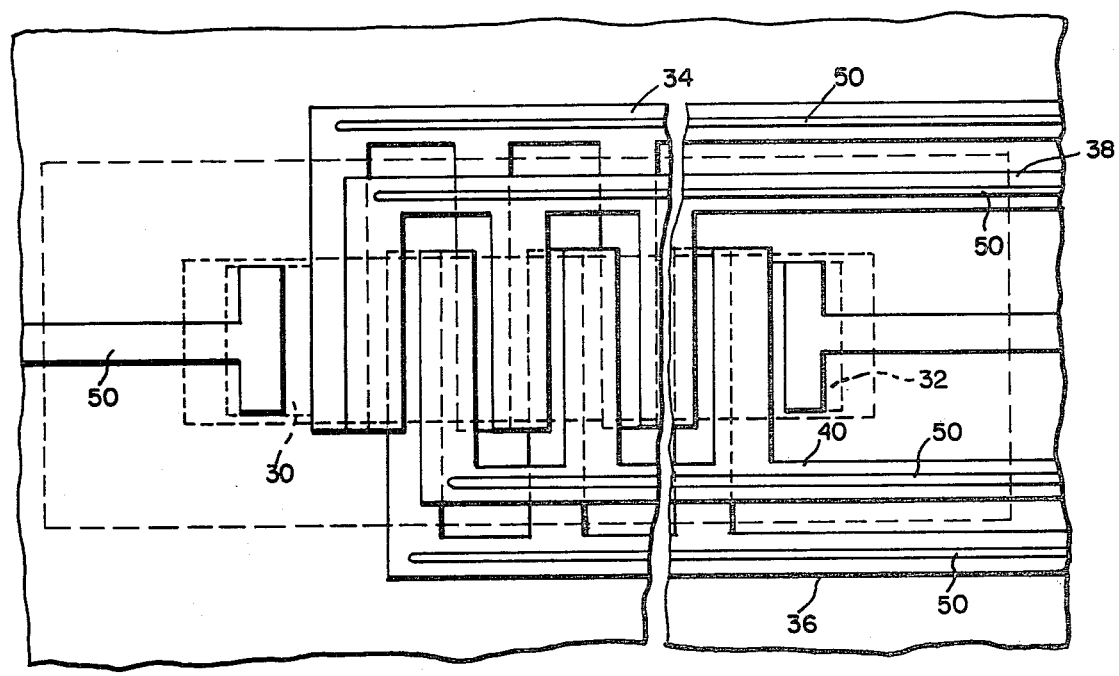
Figure 15:
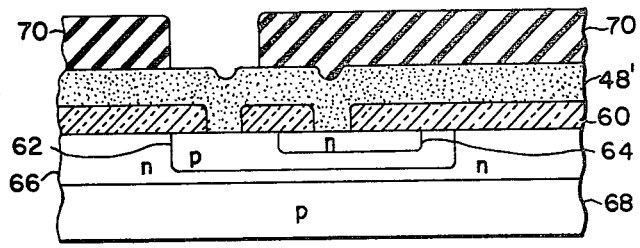
Figure 16:
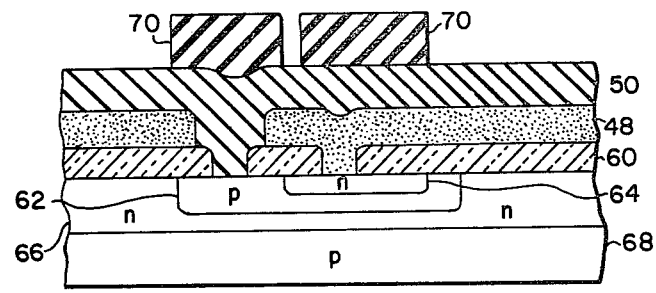
Figure 17:
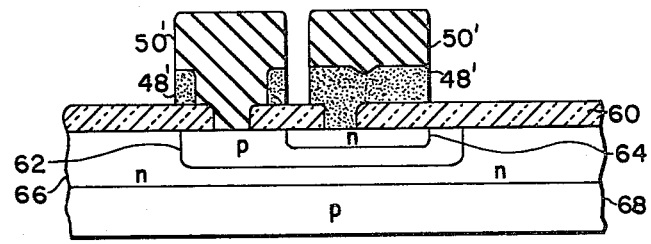

Referring now to FIGS. 12A and 12B, the patterned aluminum layer 50 provides a plasma etch resistant mask for removing the exposed portions of the polycrystalline silicon layer 48. The photoresist layer 52 is then removed, here using a suitable plasma etching, thereby completing the formation of the conductors for the source region 30, the drain region 32 and buses 34, 36, 38, 40, as shown in FIG. 13.

Having described a preferred embodiment of the invention, it is now evident that other embodiments incorporating these concepts may be used. It is felt, therefore, that this invention should not be restricted to the disclosed embodiment, but rather should be limited only by the spirit and scope of the appended claims.

What is claimed is:

1. A method comprising the steps of:
   (a) forming an insulating layer with uniform thickness over a surface of a semiconductor body, such semiconductor body having a first type conductivity;
   (b) ion implanting particles generating a second type conductivity into the semiconductor body through the insulating layer forming a doped layer of predetermined doping concentration in the semiconductor body, such second type conductivity being opposite to the first type conductivity of the semiconductor body;
   (c) forming a first plurality of gate electrodes in spaced relationship on the insulating layer and over the doped layer;
   (d) ion implanting particles generating the second type conductivity through portions of the insulating layer disposed between spaced regions of the first plurality of gate electrodes into corresponding spaced regions of the doped layer disposed beneath the spaced regions of the first plurality of gate electrodes; and
   (e) forming a second plurality of gate electrodes on the portions of the insulating layer disposed between the spaced regions of the first plurality of gate electrodes and over the spaced regions of the doped layer having increased doping concentrations.

2. The method recited in claim 1 wherein both ion implantation steps are performed using substantially the same energy levels.

3. The method recited in claim 1 wherein both ion implantation steps implant the particles with substantially the same dosages.

4. A method comprising the steps of:
   (a) forming an insulating layer with uniform thickness over a surface of a semiconductor body, such semiconductor body having a first type conductivity;
   (b) ion implanting particles generating a second type conductivity with a predetermined dosage and with a predetermined energy level into the semiconductor body through the insulating layer forming a doped layer of predetermined doping concentration in the semiconductor body, such second type conductivity being opposite to the first type conductivity of the semiconductor body;
   (c) forming a first plurality of gate electrodes in spaced relationship on the insulating layer and over the doped layer;
   (d) ion implanting particles generating the second type conductivity with substantially the predetermined dosage and with substantially the predetermined energy level through portions of the insulating layer disposed between spaced regions of the first plurality of gate electrodes into corresponding spaced regions of the doped layer disposed beneath the spaced regions of the first plurality of gate electrodes, increasing the doping concentration of said corresponding spaced regions of the doped layer beneath the spaced regions of the first plurality of gate electrodes; and
   (e) forming a second plurality of gate electrodes on the portions of the insulating layer disposed between the spaced regions of the first plurality of gate electrodes and over the spaced regions of the doped layer having increased doping concentrations.

5. A method for forming a charge coupled device having a first plurality of electrically interconnected gate electrodes and a second plurality of electrically interconnected gate electrodes disposed between a source electrode and a drain electrode, comprising the steps of:
   (a) forming an insulating layer with uniform thickness over a surface of a semiconductor body, such semiconductor body having a first type conductivity;
   (b) ion implanting particles generating a second type conductivity with a predetermined dosage and with a predetermined energy level into the semiconductor body through the insulating layer forming a doped layer of predetermined doping concentration in the semiconductor body, such second type conductivity being opposite to the first type conductivity of the semiconductor body;
   (c) forming the first plurality of gate electrodes in spaced relationship on the insulating layer and over the doped layer;
   (d) ion implanting particles generating the second type conductivity with substantially the predetermined dosage and with substantially the predetermined energy level through portions of the insulating layer disposed between spaced regions of the first plurality of gate electrodes into corresponding spaced regions of the doped layer disposed beneath the spaced regions of the first plurality of gate electrodes, increasing the doping concentration of said corresponding spaced regions of the doped layer beneath the spaced regions of the first plurality of gate electrodes; and
   (e) forming the second plurality of gate electrodes on the portions of the insulating layer disposed between the spaced regions of the first plurality of gate electrodes and over the spaced regions of the doped layer having increased doping concentrations.

* * * * *